(12) United States Patent
Han

(10) Patent No.: US 6,366,144 B2
(45) Date of Patent: Apr. 2, 2002

(54) LOOP FILTERING APPARATUS FOR REDUCING FREQUENCY LOCK-UP TIME AND PHASE NOISE OF A PHASE LOCKED LOOP FOR USE IN A MOBILE TERMINAL

(75) Inventor: Mi-Yeon Han, Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/726,997

(22) Filed: Nov. 30, 2000

(30) Foreign Application Priority Data

Nov. 30, 1999 (KR) .............................................. 99/53952

(51) Int. Cl.[7] .............................. H03K 5/00; H03L 7/06
(52) U.S. Cl. ........................................ 327/156; 327/553
(58) Field of Search ................................. 327/158, 149, 327/146, 147, 553; 331/17, 16, 25, DIG. 2

(56) References Cited

U.S. PATENT DOCUMENTS 5,146,187 A * 9/1992 Vandegraaf ................... 331/17
6,097,227 A * 8/2000 Hayashi ....................... 327/158

FOREIGN PATENT DOCUMENTS

JP 11103250 A * 4/1999

* cited by examiner

Primary Examiner—Dinh T. Le
(74) Attorney, Agent, or Firm—Dilworth & Barrese, LLP

(57) ABSTRACT

A loop filtering apparatus for a phase locked loop (PLL). The loop filtering apparatus operates as a secondary loop filter in response to a lock-up detection signal indicating a non-lock-up state in order to reduce the lock-up time, and operates as a third loop filter in response to a lock-up detection signal indicating a non-lock-up state in order to minimize the phase noise.

3 Claims, 2 Drawing Sheets

LOOP FILTERING APPARATUS FOR REDUCING FREQUENCY LOCK-UP TIME AND PHASE NOISE OF A PHASE LOCKED LOOP FOR USE IN A MOBILE TERMINAL

PRIORITY

This application claims priority to an application entitled "Loop Filtering Apparatus for Reducing Frequency Lock-up Time and Phase Noise of a Phase Locked Loop for Use in a Future Mobile Terminal" filed in the Korean Industrial Property Office on Nov. 30, 1999 and assigned Ser. No. 99-53952, the contents of which are hereby incorporated by reference.

BACKGROUND OF THE INVENTION

1. Field of the Invention

The present invention relates generally to a phase locked loop (PLL) in a mobile terminal, and in particular, to a loop filtering apparatus for reducing a frequency lock-up time and minimizing a phase noise of a PLL for use in a future mobile terminal.

2. Description of the Related Art

In general, a frequency synthesizer is used to prevent an oscillation frequency from drifting or swinging with time. Such a frequency synthesizer is typically used when generating an intermediate frequency (IF) or a carrier in a mobile terminal. A frequency generated in the PLL is fixed, and a plurality of desired frequencies are obtained by multiplying the generated frequency. A conventional frequency synthesizer is illustrated in FIG. 1.

In the conventional frequency synthesizer, a loop filter 100 is typically implemented by a secondary or third loop filter. It is generally known that, compared with a third loop filter, a secondary loop filter has a relatively faster (or shorter) lock-up time and a poor cut-off characteristic. Therefore, it does not remove the attenuation component caused by the comparison frequency and the noise level added while passing through the PLL. In particular, when a fractional PLL is used, the secondary loop filter may not remove the fractional noise generated by the fractional order component.

In order to solve this problem, the prior art loop filter utilizes a third loop filter. Although the third loop filter may solve the foregoing problem, it has difficulty reducing the lock-up time. Particularly, since a proposed future IMT-2000 mobile terminal must support an inter-frequency hard handoff rather than the existing soft handoff, a PLL with a reduced lock-up time is required. The third loop filter, however, does not meet this requirement.

The disadvantages of the prior art loop filter will be described below with reference to an example. A conventional mobile terminal performs a handoff upon acquisition of a PN offset while searching pilot channels from the base stations in a neighbor list. However, an IMT 2000 mobile terminal performs a hard handoff by shifting to a corresponding frequency band. Therefore, for quick roaming, the mobile terminal must shift to the handoff frequency more quickly than to other frequencies. This requires the PLL to have a very short lock-up time. However, since the PLL in a conventional mobile terminal uses the third loop filter, there is a limitation on obtaining the proper phase noise and the reduced lock-up time by adjusting the loop band, due to the inherent trade-off between them. This problem is not easily solved satisfactorily, even by increasing a charge pump current to reduce the lock-up time by quick charging, and implementing the loop filter with a narrowed loop band to reduce the phase noise. FIG. 2 shows a third loop filter 100-1 implemented for such a frequency synthesizer.

In conclusion, the frequency synthesizer shown in FIG. 1 and the conventional secondary loop filter implemented for this frequency synthesizer fail to reduce the lockup time and the phase noise. Therefore, the conventional frequency synthesizer is not suitable for a future IMT 2000 mobile terminal.

SUMMARY OF THE INVENTION

It is, therefore, an object of the present invention to provide a PLL which is suitable for use in the future mobile terminal.

It is another object of the present invention to provide a loop filtering apparatus for a PLL, which can reduce the frequency lock-up time and minimize the phase noise.

It is yet another object of the present invention to provide a loop filtering apparatus for reducing a lock-up time and a phase noise during an operation of a PLL.

To achieve the above and other objects, a loop filtering apparatus for a phase locked loop (PLL) is provided in accordance with the present invention. The loop filtering apparatus operates as a secondary loop filter in response to a lock-up detection signal indicating a non-lock-up state in order to reduce the lock-up time, and operates as a third loop filter in response to a lock-up detection signal indicating a lock-up state in order to minimize the phase noise.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

To solve the problems of the prior art PLL, a PLL according to the present invention includes the following structural features. First, the present invention PLL overcomes the trade-off between the phase noise and the lock-up time. To this end, the PLL according to the present invention includes a separate hardware switching circuit preferably comprised of P-MOS (P-channel Metal Oxide Semiconductor) transistors in order to satisfy both the reduced lock-up time characteristic of the secondary loop filter and the low-noise characteristic of the third loop filter. The present invention provides a PLL that includes the switching circuit. The PLL according to the present invention drives the secondary loop filter before lock-up to reduce the lock-up time, and drives the third loop filter in a lock-up state to minimize the phase noise. The PLL alternatively drives the secondary loop filter or the third loop filter.

Now, a detailed description of the present invention will be made with reference to FIG. 3.

Figure 1:
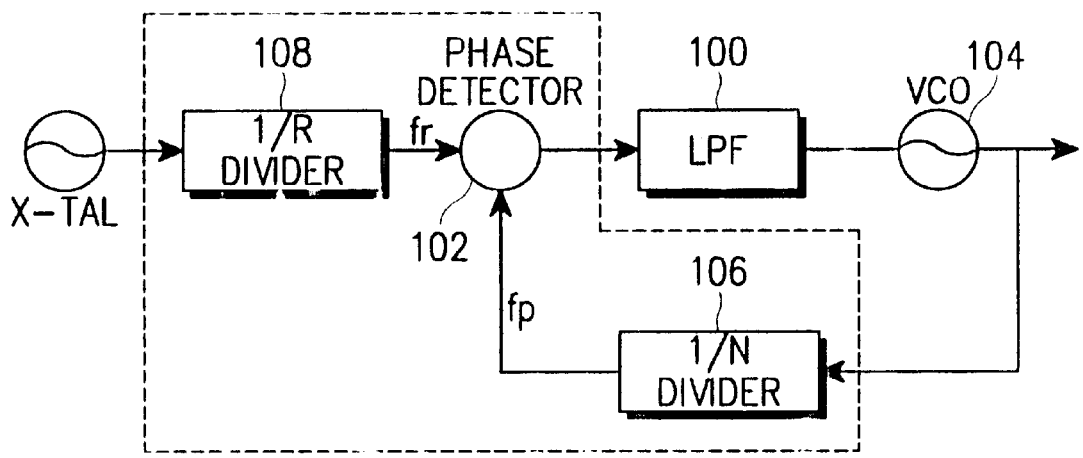
FIG. 1 is a block diagram illustrating a conventional frequency synthesizer.
Figure 2:
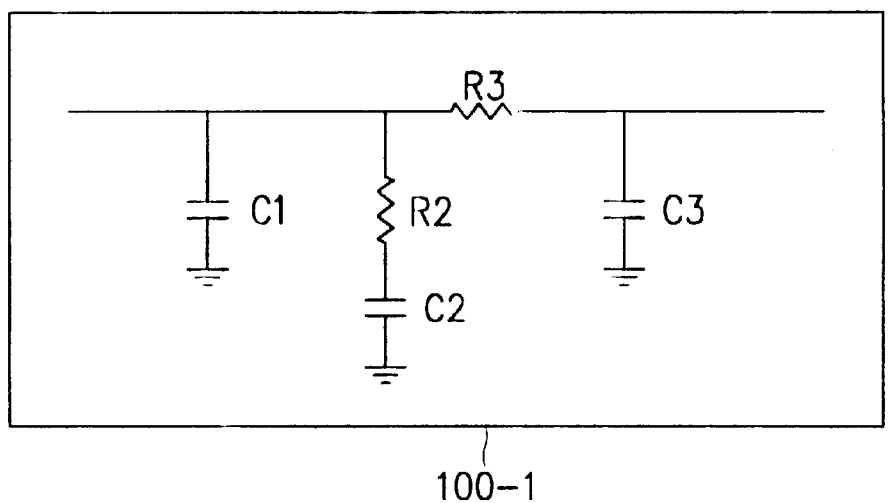
FIG. 2 is a detailed circuit diagram illustrating a conventional third loop filter in the frequency synthesizer according to the prior art.
Figure 3:
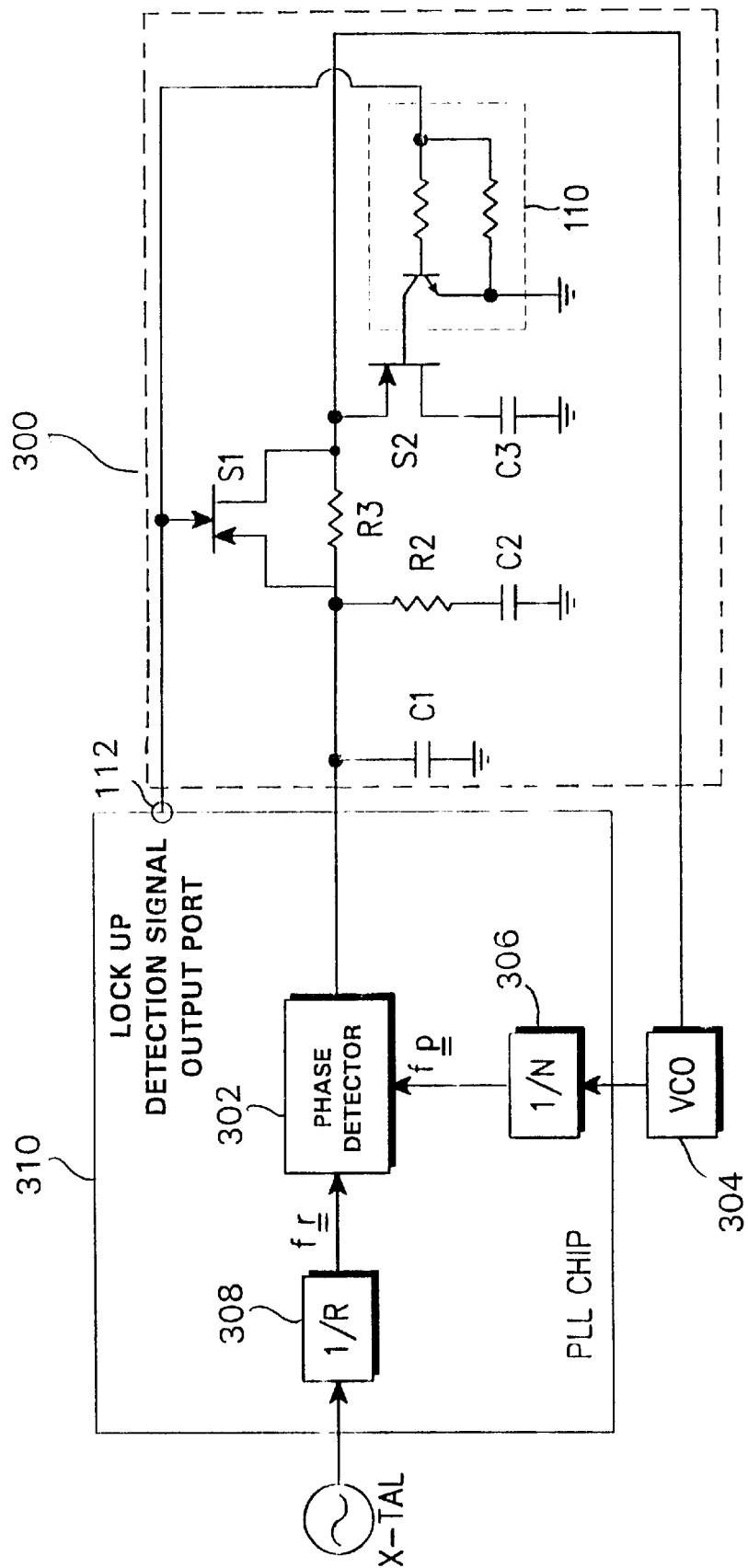
FIG. 3 is a circuit diagram illustrating a loop filtering apparatus for reducing the frequency lock-up time and minimizing the phase noise in the frequency synthesizer according to an embodiment of the present invention.

Referring to FIG. 3, a switchable secondary/third loop filter 300 for reducing the frequency lock-up time and minimizing the phase noise of the PLL according to an embodiment of the present invention is illustrated. In order to acquire the low phase noise and the reduced lock-up time, a switching circuit is connected to the secondary/third loop filter 300 to selectively operate the secondary/third loop filter 300 as either a secondary or third loop filter. The switching circuit is comprised of switches S1 and S2.

In operation, with reference to FIG. 3, a PLL chip 310 includes a phase detector 302, a 1/R divider 308, a 1/N divider 306 and a lock-up detection output port 112. The phase detector 302 compares a phase of a reference frequency component fr applied to an input of the phase detector 302 with a phase of a frequency fp which is output from a voltage controlled oscillator (VCO) 304 and divided by the 1/N divider 306.

The lock-up detection signal output port 112 outputs a lock-up detection signal indicating whether the phase is locked-up based on the compared value. When a phase error decreases resulting in the lock-up state, the lock-up detection signal output port 112 outputs a "high" signal. Alternatively, when the phase error increases resulting in a non-lock-up state, the lock-up detection signal output port 106 outputs a "low" signal. Switching between the secondary and third loop filters is performed according to the two reciprocal signals (of "high" and "low").

When a lock-up detection signal received is a "low" state (i.e., in the non-lockup state), the PLL chip 310 drives the switching circuit to configure the secondary/third loop filter 300 as a secondary loop filter via the switching operation to quickly lock-up the frequency. If a lock-up detection signal received is a "high" state after lock-up (i.e., in the lock-up state), the PLL chip 310 drives the switching circuit to configure the secondary/third loop filter 300 as a third loop filter to reduce the phase noise. By doing so, it is possible to provide a quick roaming service even when an inter-frequency hard handoff is performed.

The secondary/third loop filter 300 is comprised of capacitors C1, C2 and C3, and resistors R2 and R3; switches S1 and S2 for adjusting an order of the secondary/third loop filter 300; and an inverter 110.

Before lock-up, the circuit receives the "low" lock-up detection signal. The switch S1, preferably a P-MOS transistor, is turned ON (conductive) in response to the lock-up detection signal and a switch S2, preferably a P-MOS transistor, is turned OFF (not conductive) in response to an inversed lock-up detection signal output from the inverter 110. In this state, the loop filtering apparatus assumes the circuit topology of, and therefore operates as, a secondary order loop filter. That is, in the non-lock-up state, the secondary loop filter circuit topology is selected, since resistor R3 is bypassed and capacitor C3 is removed from the circuit.

However, after lock-up, the lock-up detection signal is switched to the "high" state. Then, in contrast, S1 is turned OFF and S2 is turned ON. In this configuration, the loop filtering apparatus assumes the topology of, and operates as, a third order loop filter circuit. That is, in the lock-up state, the third loop filter circuit topology is selected, since resistor R3 and capacitor C3 are again included in the circuit.

In sum, the loop filtering apparatus according to the present invention is automatically switched to operate as the secondary loop filter circuit or the third loop filter circuit according to the state of the lock-up detection signal output from the PLL chip 310. That is, the loop filtering apparatus operates as the secondary loop filter circuit during lock-up to acquire the reduced lock-up time, and operates as the third loop filter circuit after lock-up to remove the phase noise.

As described above, the present invention can implement a PLL with reduced lock-up time and minimized phase noise, which is advantageous for application in future mobile terminals.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A loop filtering apparatus for a frequency synthesizer, comprising:

a first order loop filter including a first capacitor;

a second order loop filter including a second capacitor connected to the first capacitor in parallel through a first resistor;

a third order loop filter including a second resistor connected in series to the first capacitor and the first resistor, said second resistor being operable according to whether a first electronic switch is conductive or not, and a third capacitor connected in parallel to all of the second capacitor, the first resistor and the second resistor, through a second electronic switch;

a phase detector for comparing a reference frequency fr with a phase of frequency fp which is output from a voltage controlled oscillator; and a lock-up detection signal output port for outputting a lock-up detection signal indicating either a non-lock-up state or a lock-up state;

wherein said lock-up detection signal output port is coupled to said first and second electronic switches whereby in response to the lock-up detection signal indicating the non-lock-up state the first and second electronic switches enable the second order loop filter and in response to the lock-up detection signal indicating the lock-up state the first and second electronic switches enable the third order loop filter.

2. The loop filtering apparatus as claimed in claim 1, wherein the first electronic switch comprises a P-MOS (P-channel Metal Oxide Semiconductor) transistor which has a source connected to the first resistor, a gate connected to the lock-up detection signal output port, and a drain connected to an input end of the second electronic switch.

3. The loop filtering apparatus as claimed in claim 1, wherein the second electronic switch comprises a P-MOS transistor which has a source connected second resistor, a drain connected to the third capacitor, and a gate connected to an output signal of an inverter that inverts the lock-up detection signal.

* * * * *